(12) United States Patent
Wang et al.

(10) Patent No.: US 12,550,450 B2
(45) Date of Patent: Feb. 10, 2026

(54) ELECTRONIC DEVICE, PHOTOELECTRIC RECEIVER, OPTICAL MODULE, AND NETWORK DEVICE

(71) Applicant: Huawei Technologies Co., Ltd., Shenzhen (CN)

(72) Inventors: Hongyu Wang, Shanghai (CN); Yi Cao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 412 days.

(21) Appl. No.: 18/356,479

(22) Filed: Jul. 21, 2023

(65) Prior Publication Data
US 2023/0361106 A1 Nov. 9, 2023

Related U.S. Application Data

(63) Continuation of application No. PCT/CN2021/073392, filed on Jan. 22, 2021.

(51) Int. Cl.
*H10D 89/60* (2025.01)
*H01L 25/16* (2023.01)

(52) U.S. Cl.
CPC ......... *H10D 89/611* (2025.01); *H01L 25/167* (2013.01)

(58) Field of Classification Search
CPC .... H10D 89/611; H10D 89/60; H01L 25/167; H02H 9/046
See application file for complete search history.

(56) References Cited

U.S. PATENT DOCUMENTS

| | | | |
|---|---|---|---|
| 6,624,992 B1 | 9/2003 | Aparin | |
| 2006/0043490 A1 | 3/2006 | Brauchler et al. | |
| 2012/0223231 A1* | 9/2012 | Nijaguna | G01J 1/0214 250/216 |
| 2014/0217899 A1* | 8/2014 | Kang | H05B 45/48 315/122 |
| 2016/0270185 A1* | 9/2016 | Zhang | H05B 45/375 |

* cited by examiner

*Primary Examiner* — Yasser A Abdelaziez
(74) *Attorney, Agent, or Firm* — Conley Rose, P.C.

(57) ABSTRACT

An electronic device includes a first transistor, an electrostatic discharging (ESD) circuit, a switch circuit, a signal input end, a first voltage end, and a switch signal control end. The ESD circuit is coupled between the first voltage end and a reference ground, and the ESD circuit is further separately coupled to a base electrode of the first transistor and the signal input end. The switch circuit is coupled between an emitting electrode of the first transistor and the reference ground, the switch circuit is further coupled to the switch signal control end.

20 Claims, 13 Drawing Sheets

ELECTRONIC DEVICE, PHOTOELECTRIC RECEIVER, OPTICAL MODULE, AND NETWORK DEVICE

CROSS-REFERENCE TO RELATED APPLICATIONS

This application is a continuation application of International Patent Application No. PCT/CN2021/073392, filed on Jan. 22, 2021, which is hereby incorporated by reference in its entirety.

TECHNICAL FIELD

This application relates to the field of microelectronic circuit technologies, and in particular, to an electronic device, a photoelectric receiver, an optical module, and a network device.

BACKGROUND

Currently, human body model electro-static discharging (HBM ESD) is often generated in a process of assembling and processing an electronic device. In addition, electro-static discharging (ESD) is usually harmful and cannot be eliminated, and electro-static discharging may damage the electronic device. For example, a signal input end in the electronic device generates static electricity in the process of assembling and processing, and an electro-static discharging current may be leaked from a transistor that is in the electronic device and that is coupled to the signal input end. Consequently, the transistor that is in the electronic device and that is coupled to the signal input end is damaged, and the electronic device fails.

SUMMARY

Embodiments of this application provide an electronic device, a photoelectric receiver, an optical module, and a network device, to resolve a problem caused by electro-static discharging.

To achieve the foregoing objective, this application uses the following technical solutions.

According to a first aspect, an electronic device is provided. The electronic device includes a first transistor, an ESD circuit, a switch circuit, a signal input end, a first voltage end, and a switch signal control end. The ESD circuit is coupled between the first voltage end and a reference ground, and the ESD circuit is further separately coupled to a base electrode of the first transistor and the signal input end. The switch circuit is coupled between an emitting electrode of the first transistor and the reference ground, the switch circuit is further coupled to the switch signal control end, and the switch signal control end is configured to control conduction and disconnection of the switch circuit. Because the electronic device provided in this embodiment of this application includes the switch circuit coupled between the emitting electrode of the first transistor and the reference ground, and in a process of assembling and processing the electronic device, the switch circuit is in a disconnect state, the emitting electrode of the first transistor and the reference ground are not conducted. In this way, in the process of assembling and processing the electronic device, static electricity generated at the signal input end can only be leaked from the ESD circuit during ESD, so that a problem caused by the static electricity generated at the signal input end during ESD is avoided. For example, the static electricity generated at the signal input end is prevented from being leaked, during ESD, from a diode formed by the base electrode and the emitting electrode of the first transistor. This protects the first transistor and further avoids a failure of the electronic device. In addition, in the process of assembling and processing the electronic device, the static electricity generated at the signal input end is leaked from the ESD circuit during ESD. Therefore, a speed of the first transistor can be improved, to improve performance of the electronic device. In addition, when the speed of the first transistor is improved, the first transistor is not damaged because of leakage, during ESD, of a current from the diode formed by the base electrode and the emitting electrode of the first transistor.

In a possible implementation, the switch circuit includes a FET. A control end of the FET is coupled to the switch signal control end, a first end of the FET is coupled to the emitting electrode of the first transistor, and a second end of the FET is coupled to the reference ground. When the FET is a P-type transistor, and the switch signal control end provides a low-level signal, the FET is conducted. When the FET is an N-type transistor, and the switch signal control end provides a high-level signal, the FET is conducted.

In a possible implementation, the switch circuit further includes a first resistor, and two ends of the first resistor are respectively coupled to the first end and the second end of the FET. The first resistor can improve stability of the electronic device. For example, when the electronic device is a trans-impedance amplifier, in a course of work of the trans-impedance amplifier, when a current input at a current input end is large, a resistance value of a trans-impedance feedback loop is adjusted to be small. In this case, self-exciting oscillation occurs in the course of work of the trans-impedance amplifier, and stability is poor. Because the switch circuit includes the first resistor, and a resistance value of the first resistor is commonly large, stability of the electronic device in a course of work can be improved.

In a possible implementation, the control end of the FET is a gate electrode, the second end of the FET is a source electrode, and the first end of the FET is a drain electrode.

In a possible implementation, the FET is a metal oxide semiconductor FET. Because the FET is the metal oxide semiconductor FET, the first transistor and the FET may be prepared by using a bipolar complementary metal-oxide-semiconductor (BiCMOS) technology. This can simplify a preparing process of the electronic device.

In a possible implementation, the electronic device further includes a power supply circuit, the switch signal control end is coupled to the power supply circuit, and the power supply circuit is configured to provide a switch signal for the switch signal control end. When the electronic device works, the switch signal may be provided for the switch signal control end through the power supply circuit, to control conduction of the switch circuit.

In a possible implementation, the ESD circuit includes a first diode and a second diode, the first diode is coupled between the first voltage end and the signal input end, and the second diode is coupled between the signal input end and the reference ground. The first diode and the second diode in the ESD circuit form a pair of back biased diodes, which may provide a current leaking path from a power source to the ground. Therefore, in the process of assembling and processing the electronic device, the static electricity generated at the signal input end can be leaked through the ESD circuit.

In a possible implementation, the electronic device further includes a trans-impedance feedback loop, a load, a second voltage end, and a voltage output end. A first end of the load is coupled to the second voltage end, and a second end of the load is coupled to a collector-electrode of the first transistor. A first end of the trans-impedance feedback loop is coupled to the base electrode of the first transistor, a second end of the trans-impedance feedback loop is coupled to the second end of the load, and the voltage output end is coupled to the second end of the load. In this implementation, the electronic device is the trans-impedance amplifier. In this case, the signal input end is the current input end. In a process of assembling and processing the trans-impedance amplifier and a photoelectric diode, the switch circuit is in a disconnect state. Therefore, the emitting electrode of the first transistor and the reference ground are not conducted. In this way, when the trans-impedance amplifier and the photoelectric diode are assembled and processed, static electricity generated at the current input end can be leaked only from the ESD circuit during ESD. This avoids leakage, during ESD, of the static electricity generated at the current input end from the diode formed by the base electrode and the emitting electrode of the first transistor, protects the first transistor and further avoids a failure of the trans-impedance amplifier. In addition, when the trans-impedance amplifier and the photoelectric diode are assembled and processed, the static electricity generated at the current input end is leaked from the ESD circuit during ESD. Therefore, the speed of the first transistor can be improved, to improve performance of the trans-impedance amplifier. In addition, when the speed of the first transistor is improved, the first transistor is not damaged because of leakage, during ESD, of a current from the diode formed by the base electrode and the emitting electrode of the first transistor.

In a possible implementation, the electronic device further includes a trans-impedance feedback loop, a load, a driver circuit, a current source, a second voltage end, and a voltage output end. A first end of the load is coupled to the second voltage end, and a second end of the load is coupled to a collector-electrode of the first transistor. A first end of the trans-impedance feedback loop is coupled to the base electrode of the first transistor. The driver circuit is coupled between the second voltage end and a second end of the trans-impedance feedback loop. The driver circuit is further coupled to the second end of the load. The current source is coupled between the second end of the trans-impedance feedback loop and the reference ground. The voltage output end is coupled to the second end of the load. In this implementation, the electronic device is the trans-impedance amplifier. In this case, the signal input end is the current input end. The trans-impedance amplifier in this implementation has a same technical effect as the trans-impedance amplifier in the foregoing implementation, and details are not described herein again. In addition, the trans-impedance amplifier includes the driver circuit. Therefore, an output drive strength of the voltage output end can be improved through the driver circuit.

In a possible implementation, the electronic device further includes a trans-impedance feedback loop, a load, a driver circuit, a current source, a second voltage end, and a voltage output end. A first end of the load is coupled to the second voltage end, and a second end of the load is coupled to a collector-electrode of the first transistor. A first end of the trans-impedance feedback loop is coupled to the base electrode of the first transistor. The driver circuit is coupled between the second voltage end and a second end of the trans-impedance feedback loop. The driver circuit is further coupled to the second end of the load. The current source is coupled between the second end of the trans-impedance feedback loop and the reference ground. The voltage output end is coupled to the second end of the trans-impedance feedback loop. In this implementation, the electronic device is the trans-impedance amplifier. In this case, the signal input end is the current input end. The trans-impedance amplifier in this implementation has a same technical effect as the trans-impedance amplifier in the foregoing implementation, and details are not described herein again. In addition, the trans-impedance amplifier includes the driver circuit. Therefore, an output drive strength of the voltage output end can be improved through the driver circuit.

In a possible implementation, the trans-impedance feedback loop includes a second resistor. The second resistor may be an adjustable resistor.

In a possible implementation, the load includes a third resistor.

In a possible implementation, the driver circuit includes a second transistor. A base electrode of the second transistor is coupled to the second end of the load, a collector-electrode of the second transistor is coupled to the second voltage end, and an emitting electrode of the second transistor is coupled to the second end of the trans-impedance feedback loop.

In a possible implementation, the electronic component further includes a parasitic capacitance reduction circuit and a third voltage end. The parasitic capacitance reduction circuit is coupled between the collector-electrode of the first transistor and the second end of the load. The parasitic capacitance reduction circuit is further coupled to the third voltage end, and the third voltage end is configured to control conduction or disconnection of the parasitic capacitance reduction circuit. Because the trans-impedance amplifier includes the parasitic capacitance reduction circuit, it can be learned from the Miller effect that a parasitic capacitance generated at the current input end may be reduced through the parasitic capacitance reduction circuit.

In a possible implementation, the parasitic capacitance reduction circuit includes a third transistor. A base electrode of the third transistor is coupled to the third voltage end, a collector-electrode of the third transistor is coupled to the second end of the load, and an emitting electrode of the third transistor is coupled to the collector-electrode of the first transistor.

In a possible implementation, the electronic device further includes a fourth resistor, a signal source, and at least one common-base circuit that is connected in series between the collector-electrode of the first transistor and the voltage output end. One end of the fourth resistor is coupled to the signal input end, and another end is coupled to the signal source. The signal source is further coupled to the reference ground. In this implementation, the electronic device is a distributed amplifier. In this case, the signal input end is a voltage input end. In a process of assembling and processing the distributed amplifier and another device, the switch circuit is in a disconnect state. Therefore, the emitting electrode of the first transistor and the reference ground are not conducted. In this way, when the distributed amplifier and the another device are assembled and processed, static electricity generated at the voltage input end can be leaked only from the ESD circuit during ESD. This avoids leakage, during ESD, of the static electricity generated at the voltage input end from the diode formed by the base electrode and the emitting electrode of the first transistor, protects the first transistor and further avoids a failure of the distributed amplifier. In addition, when the distributed amplifier and the another device are assembled and processed, the static electricity generated at the voltage input end is leaked from the ESD circuit during ESD. Therefore, the speed of the first transistor can be improved, to improve performance of the distributed amplifier. In addition, when the speed of the first transistor is improved, the first transistor is not damaged because of leakage, during ESD, of a current from the diode formed by the base electrode and the emitting electrode of the first transistor.

In a possible implementation, the common-base circuit includes a transistor, a capacitor, and a resistor. Both a first end of the capacitor and a first end of the resistor are coupled to a base electrode of the transistor, a second end of the capacitor is coupled to the reference ground, and a second end of the resistor is coupled to a mains voltage end.

In a possible implementation, the common-base circuit further includes an inductor coupled to an emitting electrode of the transistor. Herein, the inductor may play a role of freewheeling and expanding bandwidth.

According to a second aspect, a photoelectric receiver is provided. The photoelectric receiver includes a photoelectric diode and the foregoing electronic device, where a signal input end of the electronic device is coupled to one electrode of the photoelectric diode. The photoelectric receiver has a same technical effect as that in the foregoing embodiment. Details are not described herein again.

According to a third aspect, an optical module is provided. The optical module includes a photoelectric transmitter and the foregoing photoelectric receiver. The optical module has a same technical effect as that in the foregoing embodiment. Details are not described herein again.

According to a fourth aspect, a network device is provided. The network device includes a printed circuit board (PCB) and the foregoing optical module, where both a photoelectric receiver and a photoelectric transmitter in the optical module are coupled to the PCB. The network device has a same technical effect as that in the foregoing embodiment. Details are not described herein again.

REFERENCE SIGNS

01—network device; 1—optical module; 2—PCB; 10—photoelectric receiver; 11—trans-impedance amplifier; 12—photoelectric diode; 20—photoelectric transmitter; 100—voltage amplifier; 13—electronic device; 14—distributed amplifier; 101—ESD circuit; 102—switch circuit; 103—power supply circuit; 104—trans-impedance feedback loop; 105—load; 106—driver circuit; 107—parasitic capacitance reduction circuit; and 108—common-base circuit.

DESCRIPTION OF EMBODIMENTS

The following describes the technical solutions in embodiments of this application with reference to the accompanying drawings in embodiments of this application. It is clear that the described embodiments are merely a part rather than all of embodiments of this application.

The following terms "first", "second" and the like are merely intended for ease of description, and shall not be understood as an indication or implication of relative importance or implicit indication of a quantity of indicated technical features. Therefore, a feature limited by "first", "second", or the like may explicitly or implicitly include one or more features. In the descriptions of this application, unless otherwise stated, "a plurality of" means two or more than two.

In embodiments of this application, unless otherwise specified and limited, the term "couple" may be a manner of implementing an electrical connection for signal transmission, and may be a direct electrical connection, or an indirect electrical connection through an intermediate medium, for example, a connection implemented by using a resistor, an inductor, or another electrical device.

In embodiments of this application, the term "and/or" describes an association relationship between associated objects and may indicate three relationships. For example, A and/or B may indicate the following cases such as, for example, only A exists, both A and B exist, and only B exists, where A and B may be singular or plural. The character "/" generally indicates an "or" relationship between the associated objects.

In embodiments of this application, the term "example" or "for example" or the like is used to represent giving an example, an illustration, or a description. Any embodiment or design scheme described as an "example" or "for example" in embodiments of this application should not be explained as being more preferred or having more advantages than another embodiment or design scheme. Exactly, use of the term "example", "for example" or the like is intended to present a relative concept in a specific manner.

Figure 1:
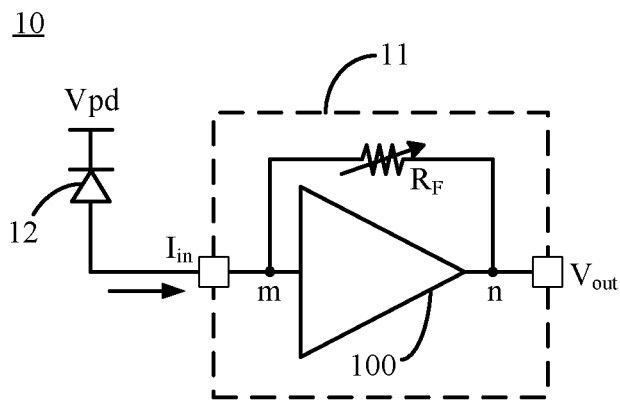
FIG. 1 is a schematic diagram of a structure of a photoelectric receiver.
Figure 2:
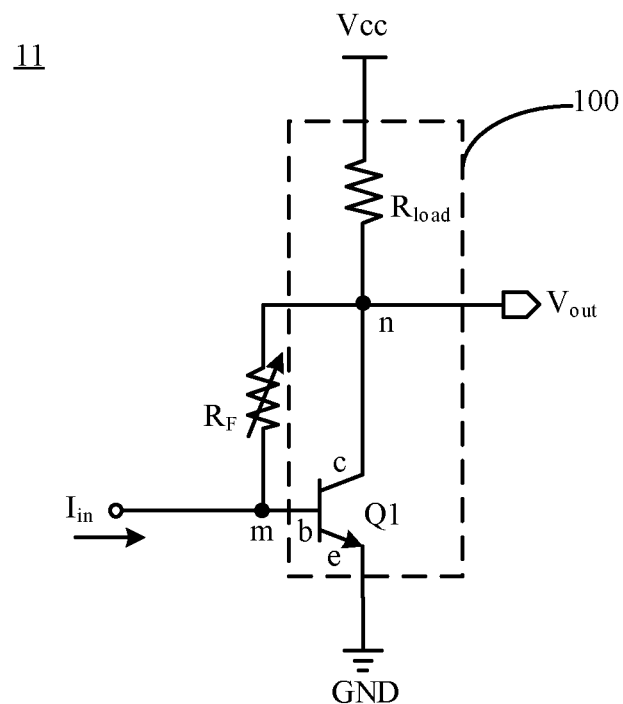
FIG. 2 is a schematic diagram of a structure of a trans-impedance amplifier according to a conventional technology.

Currently, a signal input end of an electronic device generates static electricity in a process of assembling and processing the electronic device, and an ESD current may be leaked from a transistor that is in the electronic device and that is coupled to the signal input end. Consequently, the transistor that is in the electronic device and that is coupled to the signal input end is damaged. A photoelectric receiver is used as an example. As shown in FIG. 1, a photoelectric receiver 10 includes a trans-impedance amplifier (TIA) 11 and a photoelectric diode 12. As shown in FIG. 1, a structure of the trans-impedance amplifier 11 includes a voltage amplifier 100, a feedback resistor RF, a current input end $I_{in}$, and a voltage output end $V_{out}$. An input end m of the voltage amplifier 100 is coupled to the current input end $I_{in}$, an output end n of the voltage amplifier 100 is coupled to the voltage output end $V_{out}$, and two ends of the feedback resistor RF are respectively coupled to the input end m and the output end n of the voltage amplifier 100. One electrode of the photoelectric diode 12 is coupled to the current input end $I_{in}$ of the trans-impedance amplifier 11, and the other electrode is coupled to a power supply voltage end Vpd. As shown in FIG. 2, a voltage amplifier 100 includes a first transistor Q1 and a load resistor $R_{load}$. A base electrode b of the first transistor Q1 is coupled to a current input end $I_{in}$, an emitting electrode e is coupled to a reference ground GND, a collector-electrode c is coupled to one end of the load resistor $R_{load}$, and the other end of the load resistor $R_{load}$ is coupled to a mains voltage end Vcc. When the trans-impedance amplifier 11 and the photoelectric diode 12 in the photoelectric receiver 10 are assembled, the current input end $I_{in}$ of the trans-impedance amplifier 11 generates static electricity. Because a current during ESD is mainly leaked from a diode formed by the base electrode b and the emitting electrode e of the first transistor Q1, the first electrode Q1 is prone to be damaged, and consequently, the trans-impedance amplifier 11 fails.

Figure 3:
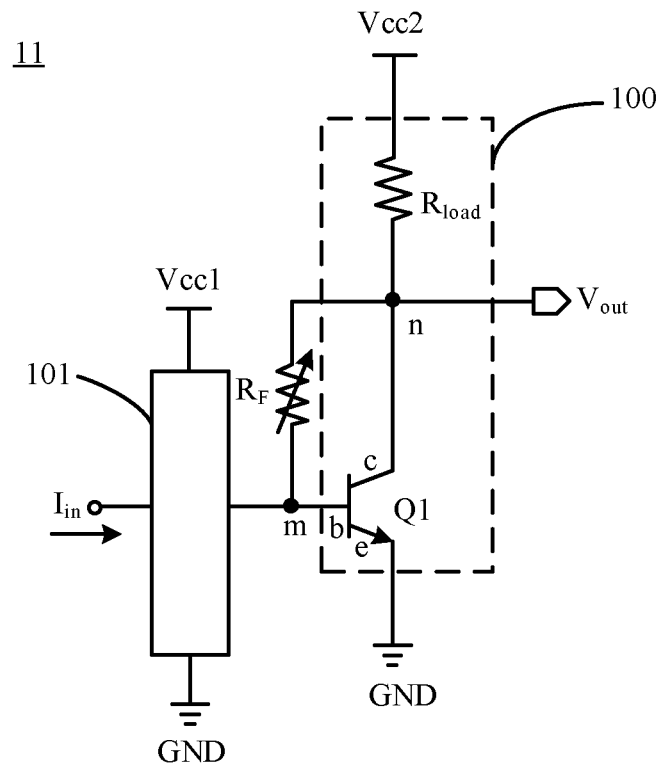
FIG. 3 is a schematic diagram of a structure of a trans-impedance amplifier.

To resolve a problem caused by ESD generated in the process of assembling and processing the electronic device, for example, a problem that the transistor coupled to the signal input end in the electronic device is damaged and consequently the electronic device fails, an ESD circuit may be added between the base electrode of the transistor and the signal input end, and an ESD current generated at the signal input end is leaked from the ESD circuit. The following uses the photoelectric receiver 10 shown in FIG. 1 as an example. To resolve a problem that the trans-impedance amplifier 11 fails due to ESD in a process of assembling and processing the trans-impedance amplifier 11 and the photoelectric diode 12 in the photoelectric receiver 10, FIG. 3 provides a schematic diagram of a structure of a trans-impedance amplifier 11. As shown in FIG. 3, the trans-impedance amplifier 11 includes a voltage amplifier 100, an ESD circuit 101, a feedback resistor RF, a current input end $I_{in}$, a voltage output end $V_{out}$, a first voltage end Vcc1, and a second voltage end Vcc2. The voltage amplifier 100 includes a load resistor $R_{load}$ and a first transistor Q1 that are connected in series between the second voltage end Vcc2 and a reference ground GND, where a base electrode b of the first transistor Q1 is coupled to the ESD circuit 101, an emitting electrode e is coupled to the reference ground GND, a collector-electrode c is coupled to one end of the load resistor $R_{load}$, the other end of the load resistor $R_{load}$ is coupled to the second voltage end Vcc2, two ends of the feedback resistor RF are separately coupled between the base electrode b and the collector-electrode c of the first transistor Q1, the ESD circuit 101 is coupled between the first voltage end Vcc1 and the reference ground GND, the ESD circuit 101 is further coupled to the current input end $I_{in}$, and the voltage output end $V_{out}$ is coupled to the collector-electrode c of the first transistor Q1. The ESD circuit 101 may provide a current leaking path during ESD.

Based on the trans-impedance amplifier 11 provided in FIG. 3, when the trans-impedance amplifier 11 and the photoelectric diode 12 are assembled and processed, because static electricity generated at the current input end Lin is leaked from the ESD circuit 101, a problem that the first transistor Q1 is damaged and the trans-impedance amplifier 11 fails due to ESD generated in the process of assembling the trans-impedance amplifier 11 and the photoelectric diode 12 can be resolved.

However, as a speed and a cut-off frequency of the first transistor Q1 continuously increase, a width of the emitting electrode e of the first transistor Q1 becomes smaller. In this case, impedance of a diode formed by the base electrode b and the emitting electrode e of the first transistor Q1 becomes smaller. Consequently, the diode formed by the base electrode b and the emitting electrode e of the first transistor Q1 becomes more fragile, and an ESD capability of the first transistor Q1 becomes weaker even though the ESD circuit 101 is added. During ESD, a current is still mainly leaked from the diode formed by the base electrode b and the emitting electrode e of the first transistor Q1. This causes damage to the first transistor Q1 and a failure of the trans-impedance amplifier 11. Although increasing a size of the ESD circuit 101 may reduce impedance of the current leaking path of the ESD circuit 101 during ESD, and enhance the ESD capability of the ESD circuit 101, a larger size of the ESD circuit 101 leads to a larger parasitic capacitance. In this case, design of a high-bandwidth and low-noise trans-impedance amplifier 11 is more difficult. In addition, with evolution of a process of preparing the first transistor Q1, the speed of the first transistor Q1 becomes faster, the width of the emitting electrode e of the first transistor Q1 is smaller, the impedance of the diode formed by the base electrode b and the emitting electrode e of the first transistor Q1 is smaller, and the diode formed by the base electrode b and the emitting electrode e of the first transistor Q1 is more fragile, in other words, the ESD capability of the first transistor Q1 is weaker. Optimizing the ESD capability of the trans-impedance amplifier 11 by merely increasing the size of the ESD circuit 101 is increasingly limited.

It can be learned from the foregoing descriptions that, optimizing the ESD capability of the electronic device by adding the ESD circuit 101 and increasing the size of the ESD circuit 101 is limited. In other words, resolving, by adding the ESD circuit 101 and increasing the size of the ESD circuit 101, a problem of damage to the first transistor Q1 coupled to the signal input end caused by ESD is limited.

Figure 4A:
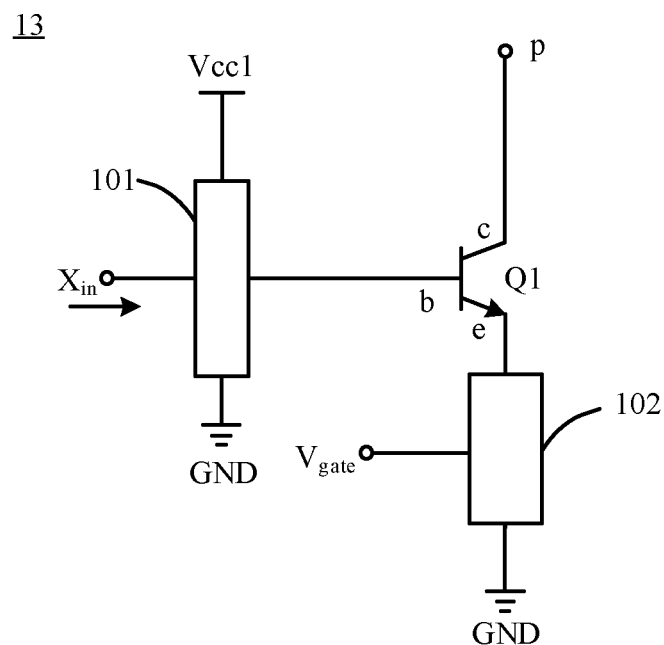
FIG. 4A is a schematic diagram of a structure of an electronic device according to an embodiment of this application.

In view of this, an embodiment of this application provides an electronic device. As shown in FIG. 4A, an electronic device 13 includes a first transistor (the transistor may also be referred to as a bipolar junction transistor (BJT)) Q1, an ESD circuit 101, a switch circuit 102, a signal input end Xin, a first voltage end Vcc1, and a switch signal control end Vgate. The ESD circuit 101 is coupled between the first voltage end Vcc1 and a reference ground GND, and the ESD circuit 101 is further separately coupled to a base electrode b and a signal input end Xin of the first transistor Q1. The switch circuit 102 is coupled between an emitting electrode e of the first transistor Q1 and the reference ground GND, and the switch circuit 102 is further coupled to the switch signal control end Vgate. The switch signal control end Vgate is configured to control conduction and disconnection of the switch circuit 102.

Herein, the signal input end Xin may be a current input end $I_{in}$, and in this case, the signal input end Xin is configured to input a current. The signal input end Xin may alternatively be a voltage input end Vin, and in this case, the signal input end Xin is configured to input a voltage.

It should be understood that, as shown in FIG. 4A, a collector-electrode c of the first transistor Q1 is coupled to a signal end p, and the signal end p may be coupled to a transistor, a resistor, or the like.

In addition, the first transistor Q1 may alternatively be a hetero-structure bipolar transistor (HBT), or may be a homojunction bipolar transistor. Because the HBT has advantages such as a higher switching speed and a higher cut-off frequency, larger output power, a larger current gain coefficient, smaller noise, better high-frequency performance, in some embodiments, the first transistor Q1 is the HBT.

In addition, the first transistor Q1 may be an NPN-type transistor, or may be a PNP-type transistor.

An embodiment of this application provides an electronic device 13. The electronic device 13 includes a first transistor Q1, an ESD circuit 101, and a switch circuit 102. The ESD circuit 101 is coupled between a first voltage end Vcc1 and a reference ground GND. The ESD circuit 101 is further separately coupled to a base electrode b of the first transistor Q1 and a signal input end Xin. The switch circuit 102 is coupled between an emitting electrode e of the first transistor Q1 and the reference ground GND. Because the electronic device 13 provided in this embodiment of this application includes the switch circuit 102 coupled between the emitting electrode e of the first transistor Q1 and the reference ground GND, and in a process of assembling and processing the electronic device 13, the switch circuit 102 is in a disconnect state, the emitting electrode e of the first transistor Q1 and the reference ground GND are not conducted (in other words, are disconnected). In this way, in the process of assembling and processing the electronic device 13, static electricity generated at the signal input end Xin can only be leaked from the ESD circuit 101 during ESD, so that a problem caused by the static electricity generated at the signal input end Xin during ESD is avoided. For example, the static electricity generated at the signal input end Xin is prevented from being leaked, during ESD, from a diode formed by the base electrode b and the emitting electrode e of the first transistor Q1. This protects the first transistor Q1 and further avoids a failure of the electronic device 13. In addition, in the process of assembling and processing the electronic device 13, the static electricity generated at the signal input end Xin is leaked from the ESD circuit 101 during ESD. Therefore, a speed of the first transistor Q1 can be improved, to improve performance of the electronic device 13. In addition, when the speed of the first transistor Q1 is improved, the first transistor Q1 is not damaged because of leakage, during ESD, of a current from the diode formed by the base electrode b and the emitting electrode e of the first transistor Q1.

On this basis, it should be noted that, in a course of work of the electronic device 13, the switch signal control end Vgate controls conduction of the switch circuit 102. In this case, the emitting electrode e of the first transistor Q1 and the reference ground GND are conducted, and therefore the electronic device 13 can work normally. It can be learned from the foregoing descriptions that the switch circuit 102 in the electronic device 13 provided in this embodiment of this application can avoid damage to the first transistor Q1 caused by ESD, and normal working of the electronic device 13 is not affected.

Figure 4B:
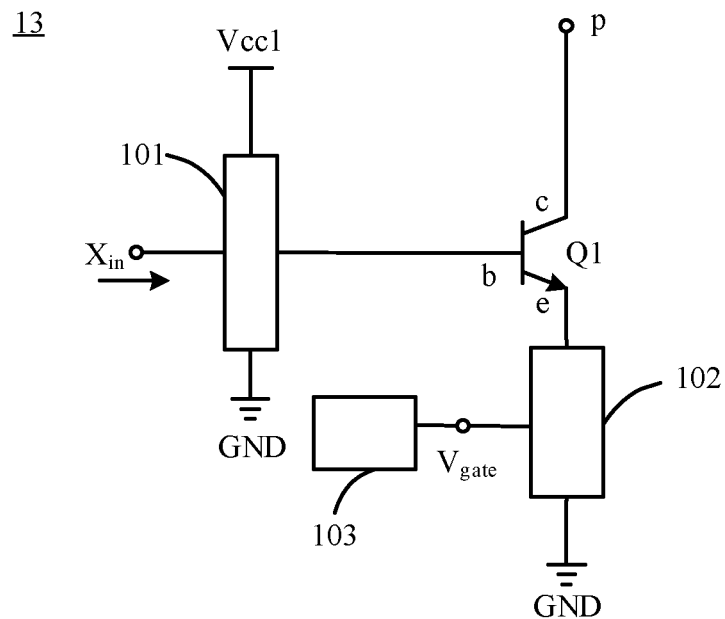
FIG. 4B is a schematic diagram of a structure of an electronic device according to another embodiment of this application.

In some embodiments, as shown in FIG. 4B, the electronic device 13 further includes a power supply circuit 103. The switch signal control end Vgate is coupled to the power supply circuit 103, and the power supply circuit 103 is configured to provide a switch signal for the switch signal control end Vgate.

Herein, when the electronic device 13 works, the switch signal may be provided for the switch signal control end Vgate through the power supply circuit 103, to control conduction of the switch circuit 102.

Figure 5A:
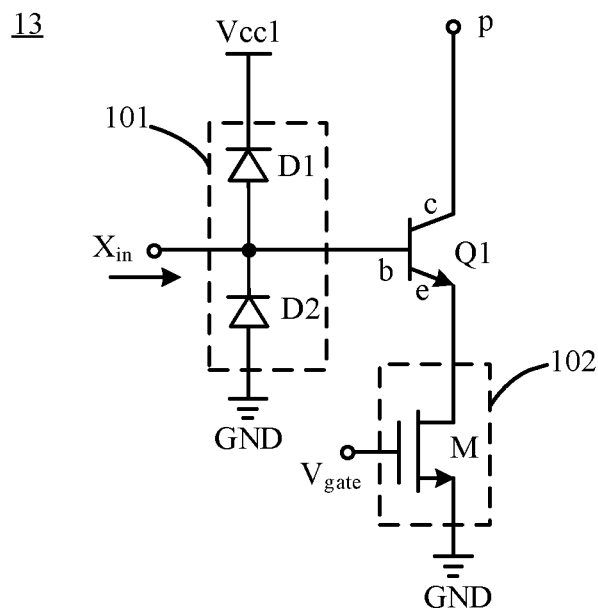
FIG. 5A is a schematic diagram of a structure of an electronic device according to still another embodiment of this application.
Figure 5B:
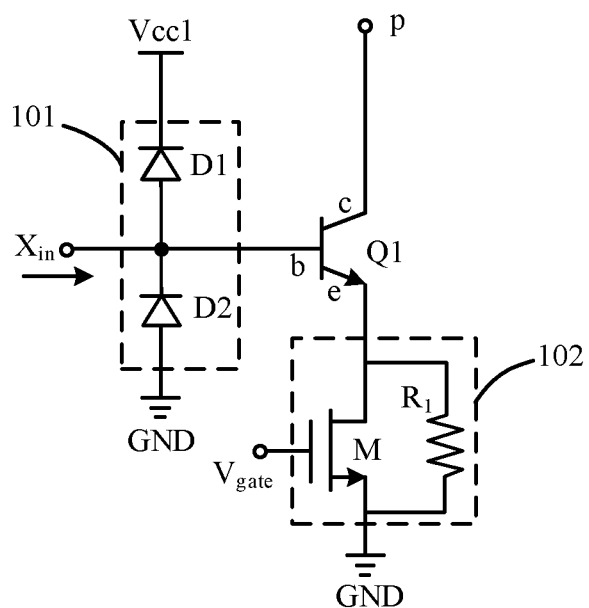
FIG. 5B is a schematic diagram of a structure of an electronic device according to yet another embodiment of this application.

For the foregoing switch circuit 102, in some embodiments, as shown in FIG. 5A, the foregoing switch circuit 102 includes a field-effect transistor (FET) M. A control end (that is, a gate electrode) of the FET M is coupled to a switch signal control end Vgate, a first end of the FET M is coupled to an emitting electrode e of a first transistor Q1, and a second end of the FET M is coupled to a reference ground GND. In some other embodiments, as shown in FIG. 5B, the foregoing switch circuit 102 includes a FET M and a first resistor R1. A control end of the FET M is coupled to a switch signal control end Vgate, a first end of the FET M is coupled to an emitting electrode e of a first transistor Q1, and a second end of the FET M is coupled to a reference ground GND. Two ends of the first resistor R1 are respectively coupled to the first end and the second end of the FET M, that is, the first resistor R1 is connected in parallel to the first end and the second end of the FET M. When the switch circuit 102 includes the first resistor R1, the first resistor R1 may improve stability of the electronic device.

In this case, the first end of the FET M may be a source electrode, and the second end of the FET M may be a drain electrode; or the first end of the FET M may be the drain electrode, and the second end of the FET M may be the source electrode.

On this basis, the FET M may be a P-type transistor, or may be an N-type transistor. When the FET M is a P-type transistor, and the switch signal control end Vgate provides a low-level signal, the FET M is conducted. When the FET M is an N-type transistor, and the switch signal control end Vgate provides a high-level signal, the FET M is conducted.

In addition, the FET M may be a junction FET (JFET), or may be a metal-oxide-semiconductor FET (MOSFET). When the FET M is a MOSFET, the first transistor Q1 and the FET M may be prepared by using a BiCMOS technology. This can simplify a preparing process of the electronic device 13.

It should be understood that, in addition to the FET M, or in addition to the FET M and the first resistor R1, the switch circuit 102 may further include another device connected in series and/or in parallel to the FET M, for example, a resistor. Details are not described herein.

In some embodiments, as shown in FIG. 5A and FIG. 5B, the ESD circuit 101 includes a first diode D1 and a second diode D2. The first diode D1 is coupled between a first voltage end Vcc1 and a signal input end Xin, and the second diode D2 is coupled between the signal input end Xin and the reference ground GND.

Herein, a positive electrode of the first diode D1 is coupled to the signal input end Xin, and a negative electrode of the first diode D1 is coupled to the first voltage end Vcc1.

A positive electrode of the second diode D2 is coupled to the reference ground GND, and a negative electrode of the second diode D2 is coupled to the signal input end Xin. The first diode D1 and the second diode D2 are both back biased diodes.

It should be noted that the first diode D1 and the second diode D2 in the ESD circuit 101 form a pair of back biased diodes, which may provide a current leaking path from a power source to the ground. Therefore, in a process of assembling and processing the electronic device 13, static electricity generated at the signal input end Xin can be leaked through the ESD circuit 101.

When the electronic device 13 is a trans-impedance amplifier 11, the trans-impedance amplifier 11 is mainly used in an optical receiver of an optical module in a network device. In view of this, an embodiment of this application provides a network device. The network device may be, for example, a router or a switch. An implementation form of the network device is not specially limited in this embodiment of this application.

Figure 6:
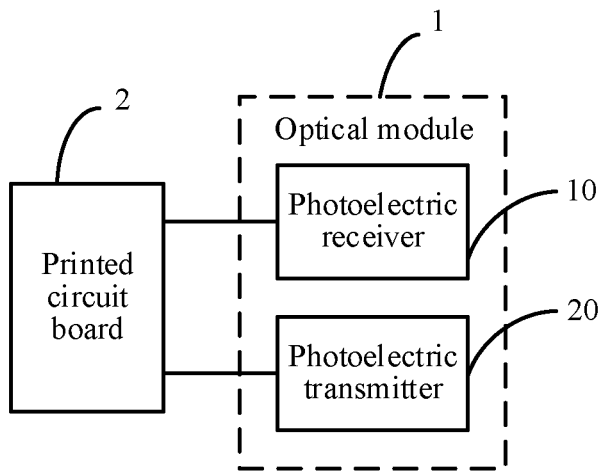
FIG. 6 is a schematic diagram of a structure of a network device according to an embodiment of this application.

As shown in FIG. 6, a main structure of the network device 01 includes an optical module 1 and a PCB 2. As shown in FIG. 6, the optical module 1 includes a photoelectric receiver 10 and a photoelectric transmitter 20. Both the photoelectric receiver 10 and the photoelectric transmitter 20 in the optical module 1 are coupled to the PCB 2. The photoelectric transmitter 20 is configured to convert an electrical signal into an optical signal, an optical fiber transmits the optical signal to the photoelectric receiver 10, and the photoelectric receiver 10 is configured to convert the optical signal into the electrical signal.

An embodiment of this application further provides a photoelectric receiver 10. The photoelectric receiver 10 may be used in the foregoing optical module 1.

As shown in FIG. 1, a main structure of the photoelectric receiver 10 provided in this embodiment of this application includes a trans-impedance amplifier 11 and a photoelectric diode 12. The trans-impedance amplifier 11 includes a current input end $I_{in}$ and a voltage output end $V_{out}$. One electrode of the photoelectric diode 12 is coupled to the current input end $I_{in}$ of the trans-impedance amplifier 11, and the other electrode of the photoelectric diode 12 is coupled to a power supply voltage end Vpd.

In some embodiments, a positive electrode of the photoelectric diode 12 is coupled to the current input end $I_{in}$, and a negative electrode of the photoelectric diode 12 is coupled to the power supply voltage end Vpd.

A course of work of the photoelectric receiver 10 is as follows. An optical signal transmitted by an optic fiber channel is first converted into a current signal $I_{in}$ through the photoelectric diode 12 in the photoelectric receiver 10. The current signal $I_{in}$ is transmitted to the current input end $I_{in}$ of the trans-impedance amplifier 11. The trans-impedance amplifier 11 converts the current signal $I_{in}$ into a voltage signal, amplifies the voltage signal, and outputs the voltage signal from the voltage output end $V_{out}$.

It should be understood that, in a process of assembling and processing the photoelectric receiver 10, because the current input end $I_{in}$ of the trans-impedance amplifier 11 needs to be manually coupled to one electrode of the photoelectric diode 12, and a human body carries static electricity, ESD occurs in a process of assembling the trans-impedance amplifier 11 and the photoelectric diode 12.

When the electronic device 13 is a trans-impedance amplifier 11, the following provides three types of trans-impedance amplifiers 11 as an example.

Figure 7:
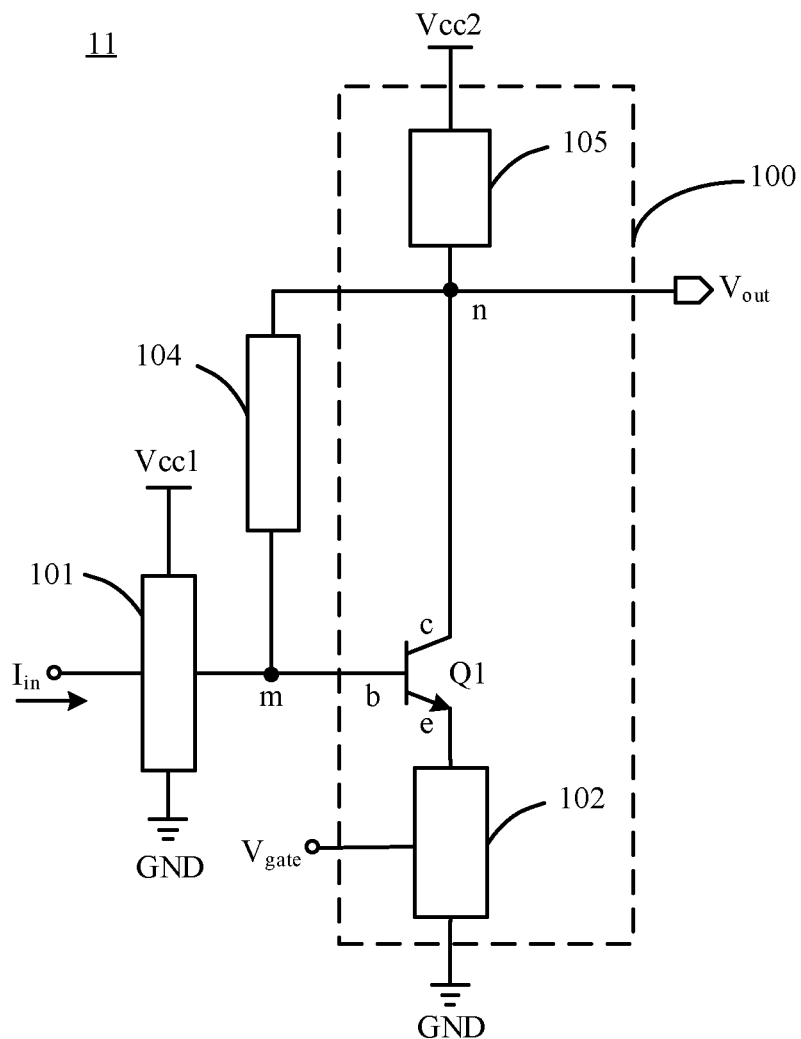
FIG. 7 is a schematic diagram of a structure of a trans-impedance amplifier according to an embodiment of this application.
Figure 8:
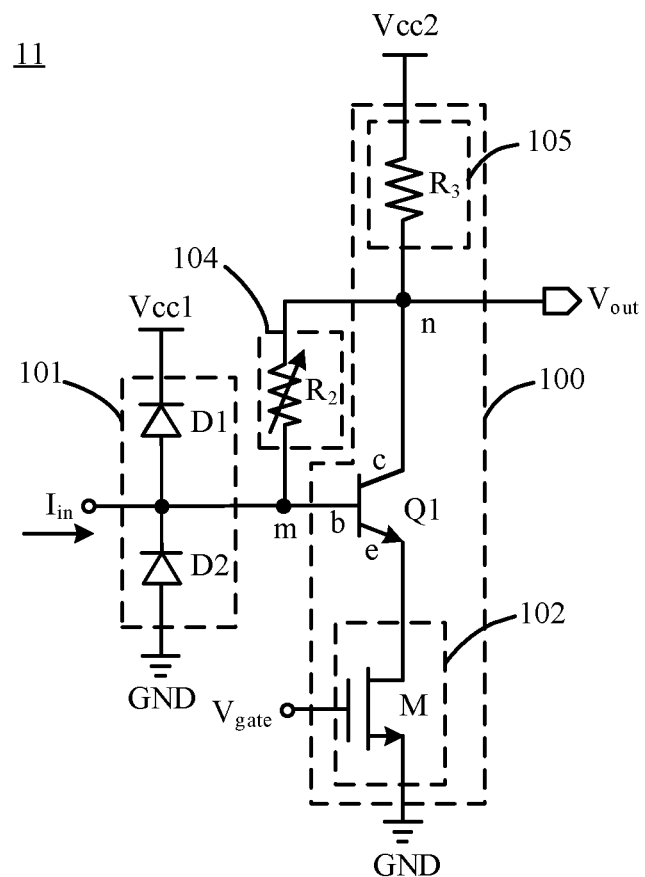
FIG. 8 is a schematic diagram of a structure of a trans-impedance amplifier according to another embodiment of this application.
Figure 9:
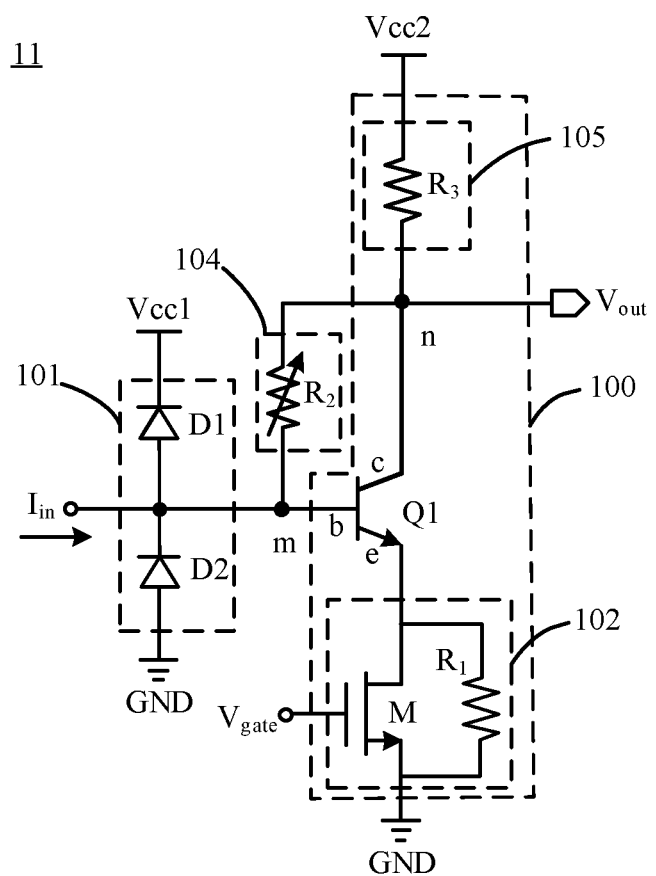
FIG. 9 is a schematic diagram of a structure of a trans-impedance amplifier according to still another embodiment of this application.

First type: As shown in FIG. 7, FIG. 8, and FIG. 9, a trans-impedance amplifier 11 provided in an embodiment of this application includes a voltage amplifier 100, an ESD circuit 101, a trans-impedance feedback loop 104, a signal input end Xin, a voltage output end $V_{out}$, a first voltage end Vcc1, a second voltage end Vcc2, and a switch signal control end Vgate. The voltage amplifier 100 includes a first transistor Q1, a switch circuit 102, and a load 105. A first end of the trans-impedance feedback loop 104 is coupled to an input end m of the voltage amplifier 100, a second end of the trans-impedance feedback loop 104 is coupled to an output end n of the voltage amplifier 100, the input end m of the voltage amplifier 100 is coupled to a current input end $I_{in}$, and the output end n of the voltage amplifier 100 is coupled to a voltage output end $V_{out}$.

It should be noted that, in the trans-impedance amplifier 11, the signal input end Xin is the current input end $I_{in}$.

The ESD circuit 101 is coupled between the first voltage end Vcc1 and a reference ground GND, and the ESD circuit 101 is further separately coupled to a base electrode b of the first transistor Q1 and the current input end $I_{in}$. The switch circuit 102 is coupled between an emitting electrode e of the first transistor Q1 and the reference ground GND, and the switch circuit 102 is further coupled to the switch signal control end Vgate, where the switch signal control end Vgate is configured to control conduction and disconnection of the switch circuit 102. A first end of the load 105 is coupled to the second voltage end Vcc2, and a second end of the load 105 is coupled to a collector-electrode c of the first transistor Q1. The first end of the trans-impedance feedback loop 104 is coupled to the base electrode b of the first transistor Q1, the second end of the trans-impedance feedback loop 104 is coupled to the second end of the load 105. The voltage output end $V_{out}$ is coupled to the second end of the load 105.

Figure 10:
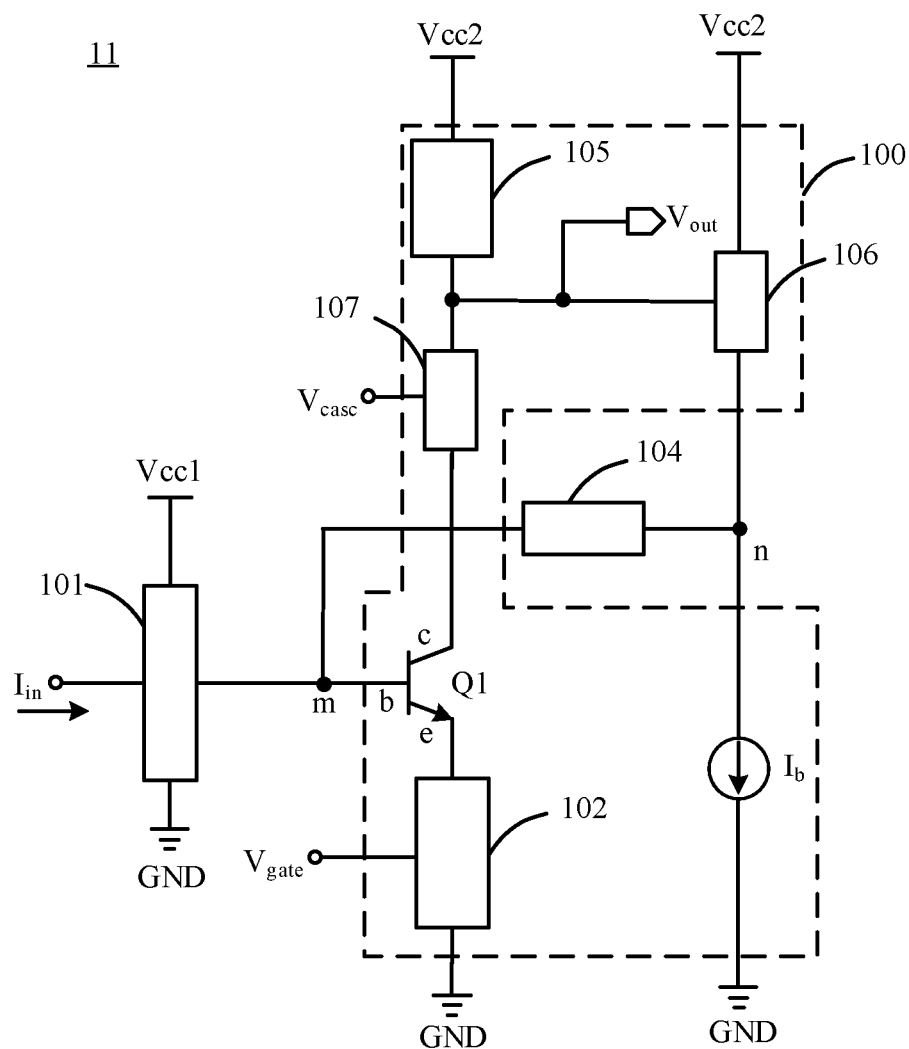
FIG. 10 is a schematic diagram of a structure of a trans-impedance amplifier according to yet another embodiment of this application.
Figure 11A:
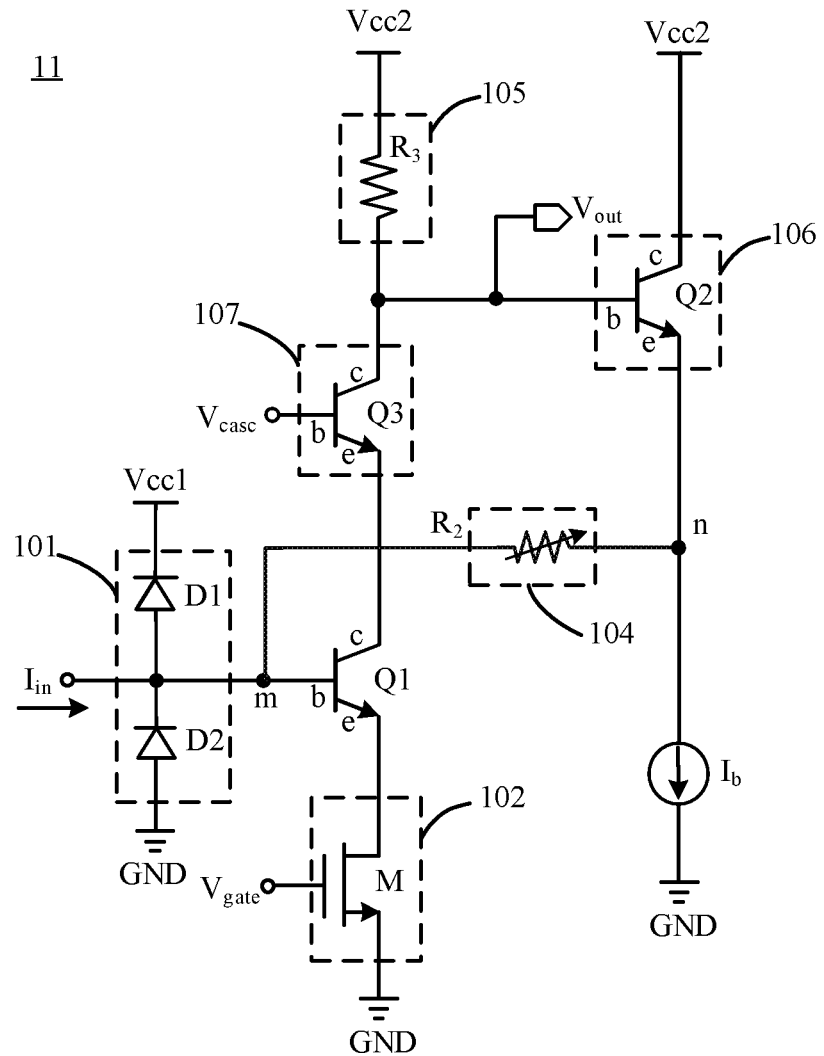
FIG. 11A is a schematic diagram of a structure of a trans-impedance amplifier according to another embodiment of this application.
Figure 11B:
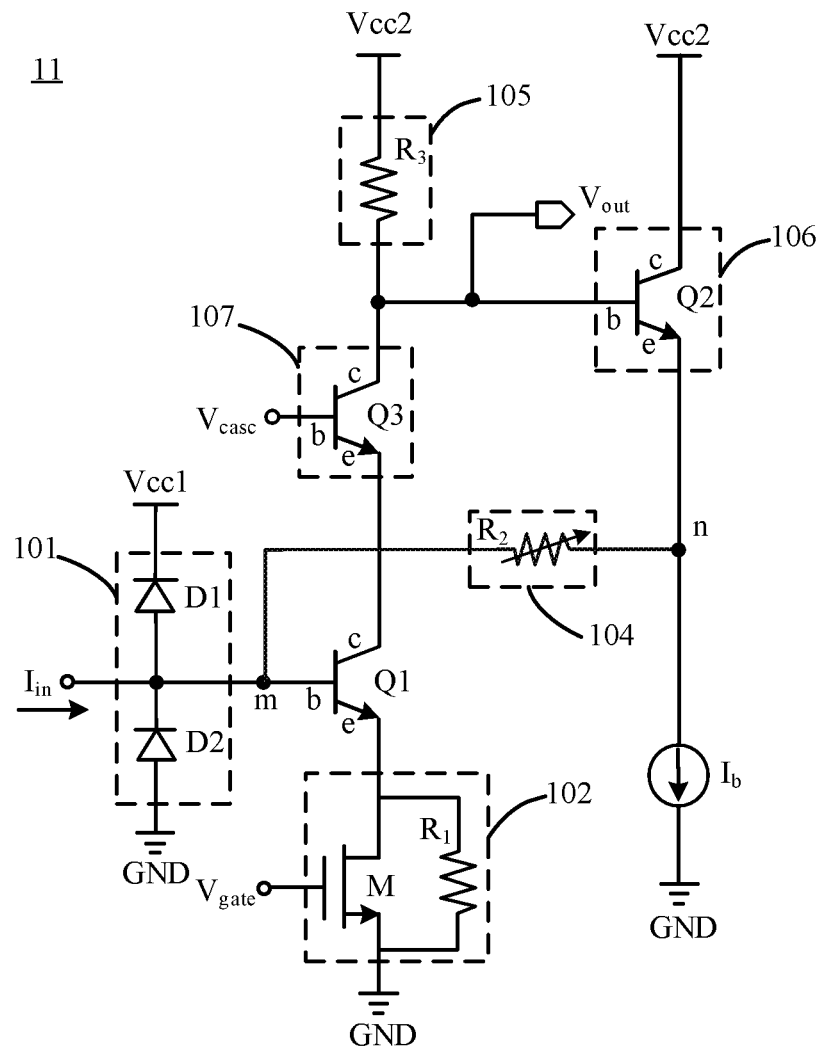
FIG. 11B is a schematic diagram of a structure of a trans-impedance amplifier according to still another embodiment of this application.

Second type: As shown in FIG. 10, FIG. 11A, and FIG. 11B, a trans-impedance amplifier 11 provided in an embodiment of this application includes a voltage amplifier 100, an ESD circuit 101, a trans-impedance feedback loop 104, a current input end $I_{in}$, a voltage output end $V_{out}$, a first voltage end Vcc1, a second voltage end Vcc2, and a switch signal control end Vgate. The voltage amplifier 100 includes a first transistor Q1, a switch circuit 102, a load 105, a driver circuit 106, and a current source $I_b$. A first end of the trans-impedance feedback loop 104 is coupled to an input end m of the voltage amplifier 100, a second end of the trans-impedance feedback loop 102 is coupled to an output end n of the voltage amplifier 100, the input end m of the voltage amplifier 100 is coupled to the current input end $I_{in}$, and the output end n of the voltage amplifier 100 is coupled to the voltage output end $V_{out}$.

The ESD circuit 101 is coupled between the first voltage end Vcc1 and a reference ground GND, and the ESD circuit 101 is further separately coupled to a base electrode b of the first transistor Q1 and the current input end $I_{in}$. The switch circuit 102 is coupled between an emitting electrode e of the first transistor Q1 and the reference ground GND, and the switch circuit 102 is further coupled to the switch signal control end Vgate, where the switch signal control end Vgate is configured to control conduction and disconnection of the switch circuit 102. A first end of the load 105 is coupled to the second voltage end Vcc2, and a second end of the load 105 is coupled to a collector-electrode c of the first transistor Q1. The first end of the trans-impedance feedback loop 104 is coupled to the base electrode b of the first transistor Q1. The driver circuit 106 is coupled between the second voltage end Vcc2 and the second end of the trans-impedance feedback loop 104. The driver circuit 106 is further coupled to the second end of the load 105. The current source $I_b$ is coupled between the second end of the trans-impedance feedback loop 104 and the reference ground GND. The voltage output end $V_{out}$ is coupled to the second end of the load 105.

Figure 11C:
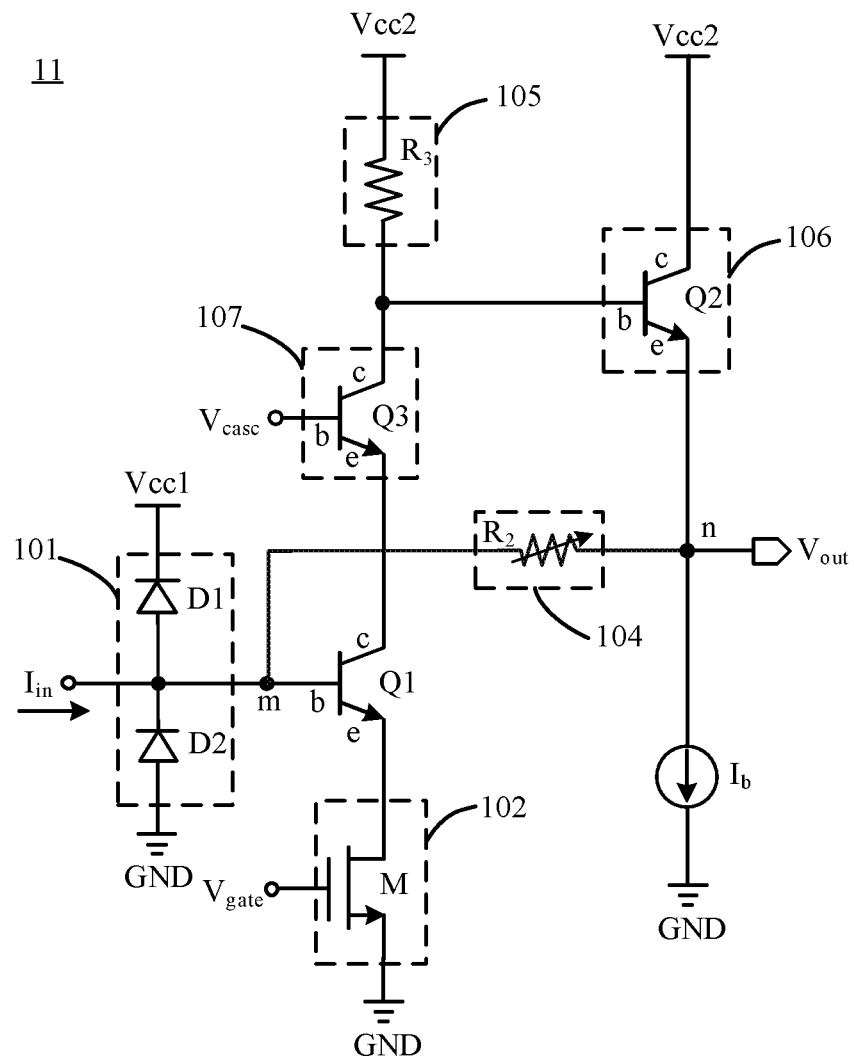
FIG. 11C is a schematic diagram of a structure of a trans-impedance amplifier according to yet another embodiment of this application.

Third type: As shown in FIG. 11C, a trans-impedance amplifier 11 provided in an embodiment of this application includes a voltage amplifier 100, an ESD circuit 101, a trans-impedance feedback loop 104, a current input end $I_{in}$, a voltage output end $V_{out}$, a first voltage end Vcc1, a second voltage end Vcc2, and a switch signal control end Vgate. The voltage amplifier 100 includes a first transistor Q1, a switch circuit 102, a load 105, a driver circuit 106, and a current source Ip. A first end of the trans-impedance feedback loop 104 is coupled to an input end m of the voltage amplifier 100, a second end of the trans-impedance feedback loop 102 is coupled to an output end n of the voltage amplifier 100, the input end m of the voltage amplifier 100 is coupled to the current input end $I_{in}$, and the output end n of the voltage amplifier 100 is coupled to the voltage output end $V_{out}$.

The ESD circuit 101 is coupled between the first voltage end Vcc1 and a reference ground GND, and the ESD circuit 101 is further separately coupled to a base electrode b of the first transistor Q1 and the current input end $I_{in}$. The switch circuit 102 is coupled between an emitting electrode e of the first transistor Q1 and the reference ground GND, and the switch circuit 102 is further coupled to the switch signal control end Vgate, where the switch signal control end V gate is configured to control conduction and disconnection of the switch circuit 102. A first end of the load 105 is coupled to the second voltage end Vcc2, and a second end of the load 105 is coupled to a collector-electrode c of the first transistor Q1. The first end of the trans-impedance feedback loop 104 is coupled to the base electrode b of the first transistor Q1. The driver circuit 106 is coupled between the second voltage end Vcc2 and the second end of the trans-impedance feedback loop 104. The driver circuit 106 is further coupled to the second end of the load 105. The current source $I_b$ is coupled between the second end of the trans-impedance feedback loop 104 and the reference ground GND. The voltage output end $V_{out}$ is coupled to the second end of the trans-impedance feedback loop 104.

In some examples, the current source $I_b$ may be a constant current source.

In embodiments of this application, the driver circuit 106 is added to the voltage amplifier 100 of the trans-impedance amplifier 11, so that an output driving capability of the voltage output end $V_{out}$ can be increased by using the driver circuit 106.

Herein, for a structure of the ESD circuit 101 in the first-type trans-impedance amplifier 11, the second-type trans-impedance amplifier 11, and the third-type trans-impedance amplifier 11, refer to the foregoing descriptions of the ESD circuit 101. Details are not described herein again.

It should be understood that the foregoing trans-impedance feedback loop 104 is configured to adjust a gain of the trans-impedance amplifier 11. Generally, a resistance value of the trans-impedance feedback loop 104 may be adjusted. When a current input at the current input end Lin is small, the resistance value of the trans-impedance feedback loop 104 needs to be adjusted to be large. When the current input at the current input end $I_{in}$ is large, the resistance value of the trans-impedance feedback loop 104 needs to be adjusted to be small.

In some examples, as shown in FIG. 8, FIG. 9, FIG. 11A, FIG. 11B, and FIG. 11C, the trans-impedance feedback loop 104 includes a second resistor R2. In some other examples, in addition to the second resistor R2, the trans-impedance feedback loop 104 may further include a capacitor, a transistor, or the like that is connected in series and/or in parallel to the second resistor R2.

Herein, the second resistor R2 may be an adjustable resistor RF. A first end of the second resistor R2 is coupled to the base electrode b of the first transistor Q1. In the first-type trans-impedance amplifier 11 provided in embodiments of this application, as shown in FIG. 8 and FIG. 9, a second end of the second resistor R2 is coupled to the second end of the load 105. In the second-type trans-impedance amplifier 11 and the third-type trans-impedance amplifier 11 provided in embodiments of this application, as shown in FIG. 11A, FIG. 11B, and FIG. 11C, a second end of the second resistor R2 is coupled to the driver circuit 106.

In some examples, as shown in FIG. 8, FIG. 9, FIG. 11A, FIG. 11B, and FIG. 11C, the load 105 includes a third resistor R3. In some other examples, in addition to the third resistor R3, the load 105 may further include a device such as an inductor connected in series and/or in parallel to the third resistor R3.

Because the trans-impedance amplifier 11 provided in embodiments of this application includes the first transistor Q1, the ESD circuit 101, and the switch circuit 102, the ESD circuit 101 is coupled between the first voltage end Vcc1 and the reference ground GND, the ESD circuit 101 is further separately coupled to the base electrode b of the first transistor Q1 and the current input end $I_{in}$, the switch circuit 102 is coupled between the emitting electrode e of the first transistor Q1 and the reference ground GND, and in a process of assembling and processing the trans-impedance amplifier 11 and the photoelectric diode 12, the switch circuit 102 is in a disconnect state, the emitting electrode e of the first transistor Q1 and the reference ground GND are not conducted (that is, are disconnected). In this way, when the trans-impedance amplifier 11 and the photoelectric diode 12 are assembled and processed, static electricity generated at the current input end $I_{in}$ can only be leaked from the ESD circuit 101 during ESD, so that a problem caused by the static electricity generated at the current input end $I_{in}$ during ESD is avoided. For example, the static electricity generated at the current input end $I_{in}$ is prevented from being leaked, during ESD, from a diode formed by the base electrode b and the emitting electrode e of the first transistor Q1. This protects the first transistor Q1 and further avoids a failure of the trans-impedance amplifier 11. In addition, when the trans-impedance amplifier 11 and the photoelectric diode 12 are assembled and processed, the static electricity generated at the current input end $I_{in}$ is leaked from the ESD circuit 101 during ESD. Therefore, a speed of the first transistor Q1 can be improved, to improve performance of the trans-impedance amplifier 11. In addition, when the speed of the first transistor Q1 is improved, the first transistor Q1 is not damaged because of leakage, during ESD, of a current from the diode formed by the base electrode b and the emitting electrode e of the first transistor Q1.

It should be understood that, in a course of work of the trans-impedance amplifier 11, the switch signal control end Vgate controls conduction of the switch circuit 102. In this case, the emitting electrode e of the first transistor Q1 and the reference ground GND are conducted, and therefore the trans-impedance amplifier 11 can work normally. It can be learned from the foregoing descriptions that the switch circuit 102 in the trans-impedance amplifier 11 provided in embodiments of this application can avoid damage to the first transistor Q1 caused by ESD, and normal working of the trans-impedance amplifier 11 is not affected.

When the electronic device 13 is the trans-impedance amplifier 11, in some embodiments, as shown in FIG. 8, FIG. 11A, and FIG. 11C, the foregoing switch circuit 102 includes a FET M. A control end of the FET M is coupled to the switch signal control end Vgate, a first end of the FET M is coupled to the emitting electrode e of the first transistor Q1, and a second end of the FET M is coupled to the reference ground GND. In some other embodiments, as shown in FIG. 9 and FIG. 11B, the foregoing switch circuit 102 includes a FET M and a first resistor R1. A control end of the FET M is coupled to the switch signal control end Vgate, a first end of the FET M is coupled to the emitting electrode e of the first transistor Q1, and a second end of the FET M is coupled to the reference ground GND. Two ends of the first resistor R1 are respectively coupled to the first end and the second end of the FET M, that is, the first resistor R1 is connected in parallel to the first end and the second end of the FET M.

Herein, for descriptions of the FET M, refer to the foregoing. Details are not described herein again.

It should be noted that, to prevent static electricity generated at the current input end $I_{in}$ from being leaked, during ESD, from a diode formed by the base electrode b and the emitting electrode e of the first transistor Q1 through the first resistor R1, a selected resistance value of the first resistor R1 needs to be large, to ensure that the static electricity generated at the current input end $I_{in}$ is leaked from the ESD circuit 101 during ESD.

In a course of work of the trans-impedance amplifier 11, when a current input at the current input end $I_{in}$ is large, a resistance value of the trans-impedance feedback loop 104 is adjusted to be small. In this case, self-exciting oscillation occurs in the course of work of the trans-impedance amplifier 11, and stability is poor. Because the switch circuit 102 includes the first resistor R1, and a resistance value of the first resistor R1 is commonly large, stability of the electronic device 13 in a course of work can be improved.

In some examples, as shown in FIG. 11A, FIG. 11B, and FIG. 11C, the driver circuit 106 includes a second transistor Q2. A base electrode b of the second transistor Q2 is coupled to the second end of the load 105, a collector-electrode c of the second transistor Q2 is coupled to the second voltage end Vcc2, and an emitting electrode e of the second transistor Q2 is coupled to the second end of the trans-impedance feedback loop 104. In some other examples, in addition to the second transistor Q2, the driver circuit 106 may further include another device connected in series and/or in parallel to the second transistor Q2, for example, a capacitor.

In addition, the second transistor Q2 may be a hetero-structure bipolar transistor, or may be a homojunction bipolar transistor. In addition, the second transistor Q2 may be an NPN-type transistor, or may be a PNP-type transistor.

In some embodiments, as shown in FIG. 10, the foregoing voltage amplifier 100 further includes a parasitic capacitance reduction circuit 107 and a third voltage end $V_{casc}$. In an example, the trans-impedance amplifier 11 provided in embodiments of this application further includes the parasitic capacitance reduction circuit 107 and the third voltage end $V_{casc}$. The parasitic capacitance reduction circuit 107 is coupled between the collector-electrode c of the first transistor Q1 and the second end of the load 105. The parasitic capacitance reduction circuit 107 is further coupled to the third voltage end $V_{casc}$, and the third voltage end $V_{casc}$ is configured to control conduction or disconnection of the parasitic capacitance reduction circuit 107.

Herein, the third voltage end $V_{casc}$ may be coupled to the foregoing power supply circuit 103, and a voltage may be provided for the third voltage end $V_{casc}$ through the power supply circuit 103, to control conduction or disconnection of the parasitic capacitance reduction circuit 107.

In some examples, as shown in FIG. 11A, FIG. 11B, and FIG. 11C, the parasitic capacitance reduction circuit 107 includes a third transistor Q3. A base electrode b of the third transistor Q3 is coupled to the third voltage end $V_{casc}$, a collector-electrode c of the third transistor Q3 is coupled to the second end of the load 105, and an emitting electrode e of the third transistor Q3 is coupled to the collector-electrode c of the first transistor Q1. In some other examples, in addition to the third transistor Q3, the parasitic capacitance reduction circuit 107 may further include another device connected in series and/or in parallel to the third transistor Q3, for example, a capacitor.

Herein, the third transistor Q3 may be a hetero-structure bipolar transistor, or may be a homojunction bipolar transistor. In addition, the third transistor Q3 may be an NPN-type transistor, or may be a PNP-type transistor.

In embodiments of this application, because the trans-impedance amplifier 11 includes the parasitic capacitance reduction circuit 107, it can be learned from the Miller effect that a parasitic capacitance generated at the current input end $I_{in}$ may be reduced through the parasitic capacitance reduction circuit 107.

Based on the foregoing descriptions, a structure of the voltage amplifier 100 in the trans-impedance amplifier 11 provided in embodiments of this application includes but is not limited to the structures shown in FIG. 7, FIG. 8, FIG. 9, FIG. 10, FIG. 11A, FIG. 11B, and FIG. 11C, or may be another structure. Details are not described herein again.

Currently, under a condition that the electronic device 13 is not damaged, a maximum electro-static voltage that can be supported by the electronic device 13 may be used to represent an HBM ESD capability of the electronic device 13. On a premise of not increasing sizes of the first diode D1 and the second diode D2 in the ESD circuit 101, it can be learned by detecting an HBM ESD capability of the trans-impedance amplifier 11 shown in FIG. 3 and an HBM ESD capability of the trans-impedance amplifier 11 shown in FIG. 11A, FIG. 11B, and FIG. 11C that the HBM ESD capability of the trans-impedance amplifier 11 shown in FIG. 3 is approximately 250 Volt (V), and the HBM ESD capability of the trans-impedance amplifier 11 shown in FIG. 11A, FIG. 11B, and FIG. 11C is approximately 700 V. It can be learned from a detection result that the trans-impedance amplifier 11 provided in embodiments of this application improves the HBM ESD capability, and avoids damage to the trans-impedance amplifier 11 during ESD.

When the foregoing electronic device 13 is a distributed amplifier, the distributed amplifier may be used in devices such as a microwave receiver and a wideband transmitter exciter.

Figure 12:
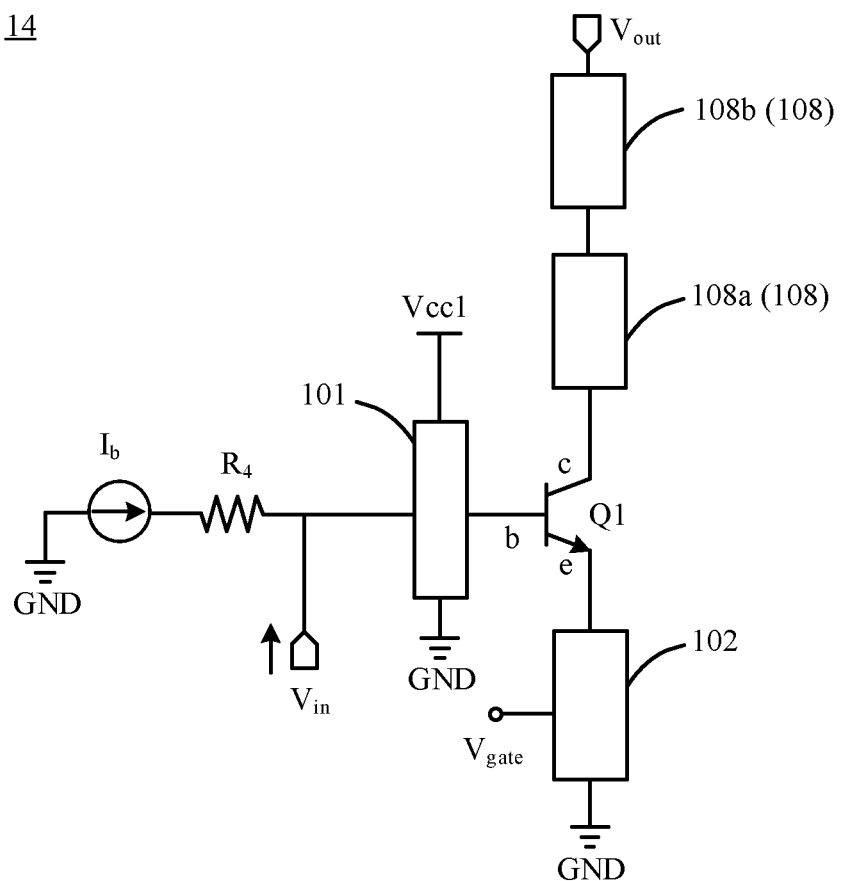
FIG. 12 is a schematic diagram of a structure of a distributed amplifier according to an embodiment of this application.

An embodiment of this application further provides a distributed amplifier. As shown in FIG. 12, a distributed amplifier 14 includes a first transistor Q1, an ESD circuit 101, a switch circuit 102, a fourth resistor R4 (which may also be referred to as a bias resistor $R_{bias}$), a signal source $X_b$, a switch signal control end Vgate, a signal input end Xin, and a voltage output end $V_{out}$.

It should be noted that, in the distributed amplifier 14, the signal input end Xin is a voltage input end Vin. The signal source $X_b$ may be a voltage source $V_b$, or may be a current source $I_b$. In addition, the current source $I_b$ may be a constant current source $I_b$. In FIG. 12, an example in which the signal source $X_b$ is the current source $I_b$ is used.

The ESD circuit 101 is coupled between a first voltage end Vcc1 and a reference ground GND, and the ESD circuit 101 is further separately coupled to a base electrode b of the first transistor Q1 and the voltage input end Vin. The switch circuit 102 is coupled between an emitting electrode e of the first transistor Q1 and the reference ground GND, and the switch circuit 102 is further coupled to the switch signal control end Vgate. The switch signal control end Vgate is configured to control conduction and disconnection of the switch circuit 102. One end of the fourth resistor R4 is coupled to the voltage input end Vin, and the other end of the fourth resistor R4 is coupled to the signal source $X_b$. The signal source $X_b$ is further coupled to the reference ground GND.

As shown in FIG. 12, the distributed amplifier 14 further includes at least one common-base circuit 108 that is connected in series between a collector-electrode c of the first transistor Q1 and the voltage output end $V_{out}$.

Herein, a quantity of common-base circuits 108 set in the distributed amplifier 14 is related to magnitude of a voltage output at the voltage output end $V_{out}$, and the set quantity of common-base circuits 108 may be selected based on the magnitude of the voltage output at the voltage output end $V_{out}$. FIG. 12 is illustrated by using an example in which the distributed amplifier 14 includes two common-base circuits 108, which are respectively a first common-base circuit 108a and a second common-base circuit 108b.

In addition, for structures of the ESD circuit 101 and the switch circuit 102 in the distributed amplifier 14, refer to the descriptions of the ESD circuit 101 and the switch circuit 102 in the electronic device 13. Details are not described herein again.

In some embodiments, the common-base circuit 108 includes a transistor Q, a capacitor C, and a resistor R. Both a first end of the capacitor C and a first end of the resistor R are coupled to a base electrode b of the transistor Q, a second end of the capacitor C is coupled to the reference ground, and a second end of the resistor R is coupled to a mains voltage end. In some other embodiments, in addition to the transistor Q, the capacitor C, and the resistor R, the common-base circuit 108 may further include an inductor L coupled to an emitting electrode e of the transistor Q. Herein, the inductor L may play a role of freewheeling and expanding bandwidth.

The following uses an example in which the distributed amplifier 14 includes the first common-base circuit 108a and the second common-base circuit 108b to describe a connection relationship between devices in the common-base circuit 108.

Figure 13:
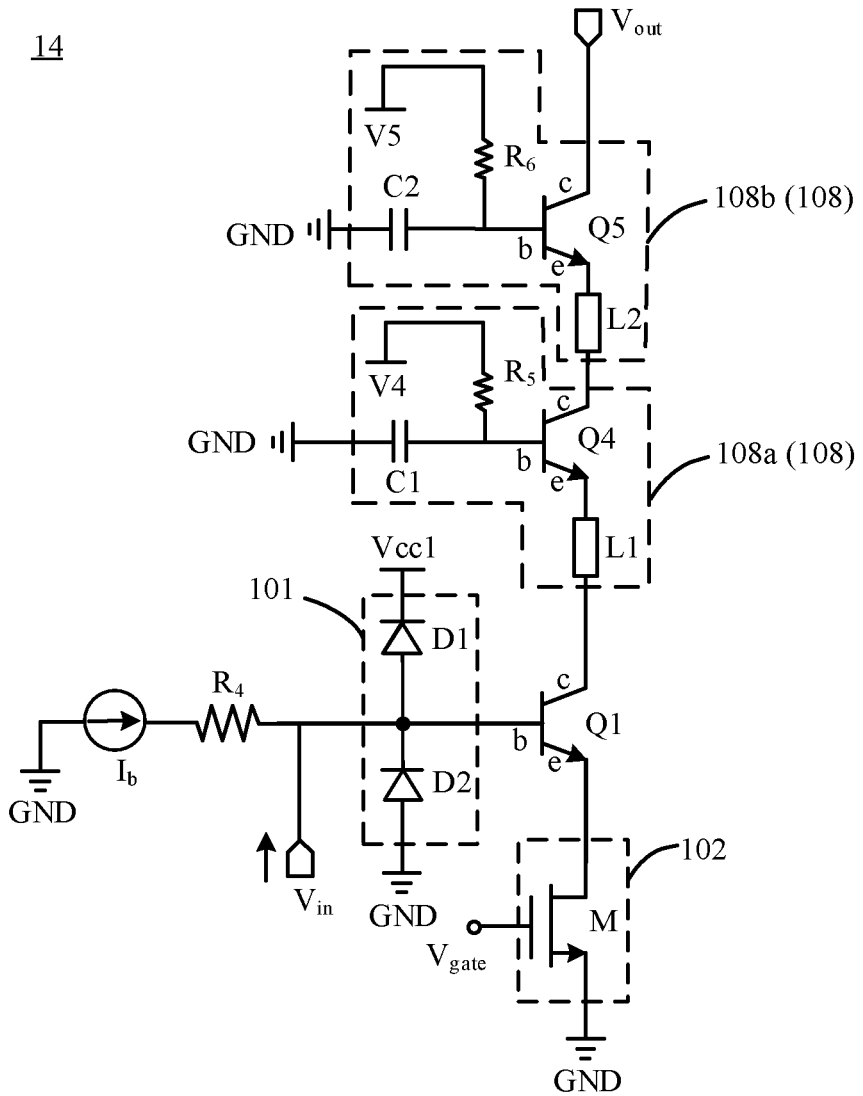
FIG. 13 is a schematic diagram of a structure of a distributed amplifier according to another embodiment of this application.

In some examples, as shown in FIG. 13, the first common-base circuit 108a includes a first inductor L1, a fourth transistor Q4, a first capacitor C1, a fifth resistor R5, and a fourth voltage end V4. A first end of the first inductor L1 is coupled to a collector-electrode c of a first transistor Q1, a second end of the first inductor L1 is coupled to an emitting electrode e of the fourth transistor Q4, and a collector-electrode c of the fourth transistor Q4 is coupled to a first end of a second inductor L2. A base electrode b of the fourth transistor Q4 is coupled to both a first end of the fifth resistor R5 and a first end of the first capacitor C1, a second end of the first capacitor C1 is coupled to a reference ground GND, and a second end of the fifth resistor R5 is coupled to the fourth voltage end V4. Herein, the fourth voltage end V4 may be configured to receive a fixed voltage. In this case, a first power supply source may be used to provide a fixed voltage for the fourth voltage end V4. In an example, the fourth voltage end V4 may be coupled to a positive electrode of the first power supply source, and a negative electrode of the first power supply source is coupled to the reference ground GND.

In some examples, as shown in FIG. 13, the second common-base circuit 108b includes the second inductor L2, a fifth transistor Q5, a second capacitor C2, a sixth resistor R6, and a fifth voltage end V5. The first end of the second inductor L2 is coupled to the collector-electrode c of the fourth transistor Q4, a second end of the second inductor L2 is coupled to an emitting electrode e of the fifth transistor Q5, and a collector-electrode c of the fifth transistor Q5 is coupled to a voltage output end $V_{out}$. A base electrode b of the fifth transistor Q5 is coupled to both a first end of the sixth resistor R6 and a first end of the second capacitor C2, a second end of the second capacitor C2 is coupled to the reference ground GND, and a second end of the sixth resistor R6 is coupled to the fifth voltage end V5. Herein, the fifth voltage end V5 may be configured to receive a fixed voltage. In this case, a second power supply source may be used to provide a fixed voltage for the fifth voltage end V5. In an example, the fifth voltage end V5 may be coupled to a positive electrode of the second power supply source, and a negative electrode of the second power supply source is coupled to the reference ground GND.

A voltage received at the fourth voltage end V4 may be the same as or different from a voltage received at the fifth voltage end V5.

It should be noted that, for types of the fourth transistor Q4 and the fifth transistor Q5, refer to the foregoing descriptions of the first transistor Q1, and details are not described herein again.

Because the distributed amplifier 14 provided in this embodiment of this application includes the first transistor Q1, the ESD circuit 101, and the switch circuit 102, the ESD circuit 101 is coupled between the first voltage end Vcc1 and the reference ground GND, the ESD circuit 101 is further separately coupled to the base electrode b of the first transistor Q1 and the voltage input end Vin, the switch circuit 102 is coupled between the emitting electrode e of the first transistor Q1 and the reference ground GND, and in a process of assembling and processing the distributed amplifier 14 and another device, the switch circuit 102 is in a disconnect state, the emitting electrode e of the first transistor Q1 and the reference ground GND are not conducted (that is, are disconnected). In this way, when the distributed amplifier 14 and the another device are assembled and processed, static electricity generated at the voltage input end Vin can only be leaked from the ESD circuit 101 during ESD, so that a problem caused by the static electricity generated at the voltage input end Vin during ESD is avoided. For example, the static electricity generated at the voltage input end Vin is prevented from being leaked, during ESD, from a diode formed by the base electrode b and the emitting electrode e of the first transistor Q1. This protects the first transistor Q1 and further avoids a failure of the distributed amplifier 14. In addition, when the distributed amplifier 14 and the another device are assembled and processed, the static electricity generated at the voltage input end Vin is leaked from the ESD circuit 101 during ESD. Therefore, a speed of the first transistor Q1 can be improved, to improve performance of the distributed amplifier 14. In addition, when the speed of the first transistor Q1 is improved, the first transistor Q1 is not damaged because of leakage, during ESD, of a current from the diode formed by the base electrode b and the emitting electrode e of the first transistor Q1.

It should be understood that, in a course of work of the distributed amplifier 14, the switch signal control end Vgate controls conduction of the switch circuit 102. In this case, the emitting electrode e of the first transistor Q1 and the reference ground GND are conducted, and therefore the distributed amplifier 14 can work normally. It can be learned from the foregoing descriptions that the switch circuit 102 in the distributed amplifier 14 provided in this embodiment of this application can avoid damage to the first transistor Q1 caused by ESD, and normal working of the distributed amplifier 14 is not affected.

In addition to the trans-impedance amplifier 11 and the distributed amplifier 14, the electronic device 13 provided in embodiments of this application may be another device. This is not listed one by one herein.

The foregoing descriptions are merely embodiments of this application, but are not intended to limit the protection range of this application. Any variation or replacement readily figured out by a person skilled in the art within the technical scope disclosed in this application shall fall within the protection range of this application. Therefore, the protection range of this application shall be subject to the protection range of the claims.

What is claimed is:

1. An electronic device, comprising:
    a first transistor comprising:
       a first base electrode; and
       a first emitting electrode;
    a switch circuit coupled between the first emitting electrode and a reference ground;
    a signal input end;
    a first voltage end;
    a switch signal control end coupled to the switch circuit and, configured to control connection of the switch circuit and disconnection of the switch circuit; and
    an electro-static discharging (ESD) circuit coupled between the first voltage end and the reference ground, coupled to the first base electrode, and coupled to the signal input end.

2. The electronic device of claim 1, wherein the switch circuit comprises a field-effect transistor (FET) comprising:
    a control end coupled to the switch signal control end;
    a first FET end coupled to the first emitting electrode; and
    a second FET end coupled to the reference ground.

3. The electronic device of claim 2, wherein the switch circuit further comprises a first resistor comprising two ends, and wherein the two ends are respectively coupled to the first FET end and the second FET end.

4. The electronic device of claim 2, wherein the FET is a metal-oxide-semiconductor FET (MOSFET).

5. The electronic device of claim 1, further comprising a power supply circuit coupled to the switch signal control end, wherein the power supply circuit is configured to provide a switch signal for the switch signal control end.

6. The electronic device of claim 1, wherein the ESD circuit comprises:
    a first diode coupled between the first voltage end and the signal input end; and
    a second diode coupled between the signal input end and the reference ground.

7. The electronic device of claim 1, wherein the first transistor further comprises a first collector-electrode, and wherein the electronic device further comprises:
    a second voltage end;
    a load comprising:
       a first load end coupled to the second voltage end; and
       a second load end coupled to the first collector-electrode;
    a voltage output end coupled to the second load end; and
    a trans-impedance feedback loop, comprising:
       a first trans-impedance feedback loop end coupled to the first base electrode; and
       a second trans-impedance feedback loop end coupled to the second load end.

8. The electronic device of claim 1, wherein the first transistor further comprises a first collector-electrode, and wherein the electronic device further comprises:
    a second voltage end,
    a load comprising:
       a first load end coupled to the second voltage end; and
       a second load end coupled to the first collector-electrode;
    a voltage output end coupled to the second load end;
    a trans-impedance feedback loop comprising:
       a first trans-impedance feedback loop end coupled to the first base electrode; and
       a second trans-impedance feedback loop end;
    a driver circuit coupled between the second voltage end and the second trans-impedance feedback loop end and coupled to the second load end; and
    a current source is coupled between the second trans-impedance feedback loop end and the reference ground.

9. The electronic device of claim 1, wherein the first transistor further comprises a first collector-electrode, and wherein the electronic device further comprises:
    a second voltage end;
    a load comprising:
       a first load end coupled to the second voltage end; and
       a second load end coupled to the first collector-electrode;
    a voltage output end;
    a trans-impedance feedback loop comprising:
       a first trans-impedance feedback loop end coupled to the first base electrode; and
       a second trans-impedance feedback loop end coupled to the voltage output end;
    a driver circuit coupled between the second voltage end and the second trans-impedance feedback loop end and coupled to the second load end; and
    a current source coupled between the second trans-impedance feedback loop end and the reference ground.

10. The electronic device of claim 7, wherein the trans-impedance feedback loop further comprises a second resistor.

11. The electronic device of claim 7, wherein the load further comprises a third resistor.

12. The electronic device of claim 8, wherein the driver circuit comprises a second transistor, and wherein the second transistor comprises:
    a second base electrode coupled to the second load end;
    a second collector-electrode coupled to the second voltage end; and
    a second emitting electrode coupled to the second trans-impedance feedback loop end.

13. The electronic device of claim 7, wherein the electronic device further comprises:
- a parasitic capacitance reduction circuit coupled between the first collector-electrode and the second load end; and
- a third voltage end coupled to the parasitic capacitance reduction circuit and configured to control connection of the parasitic capacitance reduction circuit or disconnection of the parasitic capacitance reduction circuit.

14. The electronic device of claim 13, wherein the parasitic capacitance reduction circuit comprises a third transistor, and wherein the third transistor comprises:
- a third base electrode coupled to the third voltage end;
- a third collector-electrode coupled to the second load end; and
- a third emitting electrode coupled to the first collector-electrode.

15. An optical module, comprising:
- a photoelectric transmitter; and
- a photoelectric receiver coupled to the photoelectric transmitter and comprising:
  - a photoelectric diode comprising two electrodes; and
  - an electronic device comprising:
    - a first transistor, comprising:
      - a base electrode; and
      - an emitting electrode;
    - a switch circuit coupled between the emitting electrode and a reference ground;
    - a signal input end coupled to one electrode of the two electrodes;
    - a first voltage end;
    - a switch signal control end, coupled to the switch circuit and configured to control connection of the switch circuit and disconnection of the switch circuit; and
    - an electro-static discharging circuit is coupled between the first voltage end and the reference ground, coupled to the base electrode, and coupled to the signal input end.

16. The optical module of claim 15, wherein the switch circuit comprises a field-effect transistor (FET), wherein the FET comprises:
- a control end coupled to the switch signal control end;
- a first end coupled to the emitting electrode; and
- a second end coupled to the reference ground.

17. The optical module of claim 16, wherein the switch circuit further comprises a first resistor comprising two ends, and wherein the two ends are respectively coupled to the first end and the second end.

18. The optical module of claim 16, wherein the FET is a metal-oxide-semiconductor FET (MOSFET).

19. The optical module of claim 15, wherein the electronic device further comprises a power supply circuit coupled to the switch signal control end, and wherein the power supply circuit is configured to provide a switch signal for the switch signal control end.

20. A network device, comprising:
- a printed circuit board (PCB); and
- an optical module comprising:
  - a photoelectric transmitter coupled to the PCB; and
  - a photoelectric receiver coupled to the PCB, wherein the photoelectric receiver comprises:
    - a photoelectric diode comprising at least two electrodes; and
    - an electronic device, comprising:
      - a signal input end coupled to an electrode of the at least two electrodes; and
      - a first transistor; comprising:
        - a base electrode; and
        - an emitting electrode;
      - a switch circuit coupled between the emitting electrode and a reference ground;
      - a first voltage end;
      - an electro-static discharging circuit (ESD) coupled between the first voltage end and the reference ground, coupled to the base electrode, and coupled to the signal input end; and
      - a switch signal control end coupled to the switch circuit and configured to control connection of the switch circuit and disconnection of the switch circuit.

\* \* \* \* \*